(12) United States Patent
Nathan

(10) Patent No.: US 8,798,104 B2
(45) Date of Patent: Aug. 5, 2014

(54) PULSED HIGH-POWER LASER APPARATUS AND METHODS

(76) Inventor: Nanda Nathan, Westford, MA (US)

( * ) Notice: Subject to any disclaimer, the term of this patent is extended or adjusted under 35 U.S.C. 154(b) by 832 days.

(21) Appl. No.: 12/898,915

(22) Filed: Oct. 6, 2010

(65) Prior Publication Data

US 2011/0085149 A1 Apr. 14, 2011

Related U.S. Application Data

(60) Provisional application No. 61/251,092, filed on Oct. 13, 2009.

(51) Int. Cl.
*H01S 3/30* (2006.01)
*H01S 3/10* (2006.01)
*H01S 3/08* (2006.01)

(52) U.S. Cl.
USPC .................................. 372/6; 372/26; 372/101

(58) Field of Classification Search
USPC ............................................. 372/6, 26, 101
See application file for complete search history.

(56) References Cited

U.S. PATENT DOCUMENTS

| | | | |
|---|---|---|---|
| 3,800,699 A | 4/1974 | Carley | |
| 5,657,153 A * | 8/1997 | Endriz et al. | 359/341.1 |
| 5,917,969 A * | 6/1999 | Gavrilovic et al. | 385/15 |
| 6,151,338 A | 11/2000 | Grubb et al. | |
| 6,212,310 B1 | 4/2001 | Waarts et al. | |
| 6,341,559 B1 | 1/2002 | Riepenhoff et al. | |
| 7,191,705 B2 | 3/2007 | Berg et al. | |
| 7,233,442 B1 | 6/2007 | Brown et al. | |
| 7,535,631 B2 | 5/2009 | Brown et al. | |
| 7,593,440 B2 | 9/2009 | Spinelli et al. | |
| 7,596,156 B2 | 9/2009 | Camille Cotteverte et al. | |
| 7,715,459 B2 | 5/2010 | Brown et al. | |
| 8,340,150 B2 * | 12/2012 | Volodin | 372/50.123 |
| 2001/0004289 A1 | 6/2001 | Lee et al. | |
| 2004/0182270 A1 | 9/2004 | Wiedemer et al. | |
| 2005/0115429 A1 | 6/2005 | Link | |
| 2006/0257150 A1 * | 11/2006 | Tsuchiya et al. | 398/79 |
| 2007/0062389 A1 | 3/2007 | Link | |
| 2007/0119829 A1 | 5/2007 | Vietz et al. | |
| 2009/0059968 A1 | 3/2009 | Luo et al. | |
| 2009/0141753 A1 | 6/2009 | Furuya et al. | |
| 2009/0185588 A1 * | 7/2009 | Munroe | 372/22 |
| 2009/0231681 A1 | 9/2009 | Du | |

FOREIGN PATENT DOCUMENTS

| | | |
|---|---|---|
| EP | 0101266 | 2/1984 |
| EP | 1036655 | 9/2000 |
| EP | 1375136 | 1/2004 |
| EP | 1768282 | 3/2007 |
| GB | 2265271 | 9/1993 |

(Continued)

OTHER PUBLICATIONS

E.A. Zibik, et al., "Novel single-mode fiber coupled broadband seed source for pulsed fiber laser systems," Proc. SPIE, vol. 7616, 7616k (2010).
International Search Report and Written Opinion mailed Feb. 14, 2011 for International Application No. PCT/US2010/051571 (21 pages).

(Continued)

*Primary Examiner* — Armando Rodriguez
(74) *Attorney, Agent, or Firm* — Bingham McCutchen LLP

(57) ABSTRACT

In various embodiments, output beams of multiple seed lasers differing in at least one beam characteristic are combined, amplified, and separated according to the beam characteristic(s) for use in, e.g., plateless lithographic printing.

31 Claims, 6 Drawing Sheets

(56) References Cited

FOREIGN PATENT DOCUMENTS

| | | |
|---|---|---|
| WO | WO-99/45612 | 9/1999 |
| WO | WO-03/070461 | 8/2003 |
| WO | WO-03/070466 | 8/2003 |
| WO | WO-03/070481 | 8/2003 |

OTHER PUBLICATIONS

International Search Report and Written Opinion mailed Mar. 5, 2010 for International Application No. PCT/US2010/052035 (11 pages).
Partial Search Report for International Application No. PCT/US2010/051571 issued Dec. 8, 2010 (6 pages).

\* cited by examiner

PULSED HIGH-POWER LASER APPARATUS AND METHODS

RELATED APPLICATION

This application claims the benefit of and priority to U.S. Provisional Patent Application No. 61/251,092, filed Oct. 13, 2009, the entire disclosure of which is hereby incorporated herein by reference.

FIELD OF THE INVENTION

In various embodiments, the present invention relates to high-power laser systems, and specifically to high-power laser systems capable of being randomly modulated at high frequencies.

BACKGROUND

Lasers typically emit coherent beams of monochromatic light, and are ubiquitous in many fields of technology. Many types of lasers exist, each with characteristics that may be optimized for a specific application space. For example, semiconductor diode lasers typically operate at very low power (<1 W) but may be modulated at very high frequencies (>1 GHz). In contrast, many solid-state or fiber-based lasers operate at higher power (e.g., at tens or even hundreds of watts), but are difficult to modulate, as it is challenging to quickly turn the high-power beam on and off without damaging the laser. And, while specialized solutions exist for modulating high-power fiber lasers at constant frequencies, modulating high-power lasers at random frequencies is exceedingly difficult. Random modulation is necessary for applications involving real-time analysis or interpretation of a random data stream, e.g., a digital representation of text, graphics, or other irregular data.

An important metric of laser performance is the "beam quality" of the laser (represented as $M^2$), which is a measure of the laser light collimation. A beam quality equal to one represents a diffraction-limited Gaussian beam. Semiconductor diode lasers typically have high (i.e., non-ideal) beam quality values (e.g., greater than 5, and up to several hundreds or even thousands). Solid-state and fiber lasers may have beam quality values much closer to unity (e.g., 1.1-2), making them more suitable for applications such as drilling, cutting, and printing. High beam quality (i.e., beam qualities close to unity) enables the preservation of the energy and spot size of the beam even after traveling long distances.

There exists a set of potential applications in need of a laser apparatus combining high power, high beam quality, and random modulation. Exemplary applications include three-dimensional printing, precision cutting, bio-medical and dental applications, military and LIDAR applications, among others. Another such application is plateless lithographic printing (such as that described in U.S. Patent Application Publication No. 2010/0031838 (the '838 application), the entire disclosure of which is incorporated by reference herein), in which a laser, modulated at a random frequency that depends upon an unknown data stream, is utilized to modify the ink and/or fountain solution on a printing cylinder without the use of traditional printing plates. The ink is then transferred to a permanent recording medium, and each transfer of ink may be different from the previous one. While plateless lithographic printing may be performed utilizing prior-art lasers, such systems are typically more complex and/or expensive than those described herein, and may operate at slower rates—a considerable disadvantage in commercial printing environments.

SUMMARY

Embodiments of the present invention include a laser apparatus having a high-power, high-beam-quality laser output beam that may be rapidly modulated at random frequencies ("randomly modulated"). As used herein, the term "random" means arbitrary, i.e., that the data is not constrained to a repetitive pattern. The data may be predetermined in the sense of, e.g., corresponding to the pixels of a printable image, but is considered random for purposes hereof since the demands imposed on the laser are arbitrary and, from the perspective of the laser, unpredictable.

Embodiments of the present invention also utilize such laser systems to dispense with the need for lithographic printing plates, instead facilitating direct transfer of ink from a permanent cylinder to a recording medium. Accordingly, instead of being permanently modified to exhibit oleophilic and oleophobic (or hydrophilic) regions, the cylinder—or, more accurately, the combination of ink and fountain solution on the cylinder—is effectively "programmed" with the image prior to each transfer of ink. In particular, a transferable image is realized by selective removal of the fountain solution and/or by selective alteration of the properties of the ink (i.e., removal of a solvent component thereof), and the programming "tool" that achieves such removal is a hot spot on the surface of the cylinder resulting from exposure to radiation emitted by a suitable laser system. Preferably, the cylinder surface retains no memory of the spot heating. As a result, the invention facilitates a "variable-data" approach in which each printed sheet can be different from its predecessor.

In general, printing methods in accordance with embodiments of the invention involve pre-wetting a lithographic surface and then creating a printable image by selective removal of the wetting fluid. The ability to erase the image without impractical or extreme measures represents an important advantage of this approach, and facilitates commercially practicable variable-data printing.

In one aspect, embodiments of the invention feature a laser apparatus including or consisting essentially of first and second seed lasers, a coupler, at least one amplifier, and a separator. The first and second seed lasers each emit an output beam differing in at least one beam characteristic. The coupler combines the output beams into a combined beam, and the amplifier(s) increase the power of the combined beam, thereby forming an amplified beam. The separator separates the amplified beam into first and second final output beams based on the beam characteristic(s). The line width of the amplifier(s) is less than the line width of the combined beam, whereby Brillouin scattering is suppressed in the amplifier(s). The beam characteristic(s) may include or consist essentially of wavelength or polarization or both wavelength and polarization.

Embodiments of the invention may include one or more of the following in any of a variety of combinations. The seed lasers may be operated in a complementary fashion. The seed lasers may be modulated in accordance with a substantially random frequency. The combined beam may have a substantially constant power as a function of time. The amplifier(s) may include or consist essentially of a plurality of fiber amplifiers, and the apparatus may include an inter-stage isolator disposed between two of the fiber amplifiers. The second final output beam may be directed into a beam dump or may be absorbed by the separator. The separator may include or consist essentially of a dichroic mirror, a polarization division demultiplexer, and/or a wavelength division demultiplexer.

Each of the seed lasers may be a semiconductor diode laser or a fiber laser. The first and second seed lasers may emit at wavelengths that differ from each other by an amount ranging from approximately 9 nm to approximately 100 nm. An isolator may be disposed between each of the seed lasers and the coupler and/or between the coupler and the amplifier(s). An isolator and a collimator may be disposed between the amplifier(s) and the separator. A resonant phase modulator may be disposed between the coupler and the amplifier(s). The first and second seed lasers, the coupler, the amplifier(s), and the separator may be all fiber-coupled. A modulator that modulates the output beam of the seed laser (e.g., an acousto-optic modulator or an electro-optic modulator) may be associated with each seed laser. A harmonic generator may be associated with the separator, where the frequency of the first final output beam is larger than the frequency of the amplified beam by at least a factor of two (or even at least a factor of three or four).

In another aspect, embodiments of the invention feature a method of operating a laser apparatus. First and second seed lasers are operated in a complementary fashion, such that each seed laser emits an output beam only when the other does not, the seed lasers emitting output beams differing in at least one beam characteristic. The output beams of the seed lasers are combined into a combined beam. The combined beam is amplified so as to suppress Brilliouin scattering. The combined beam is separated into two final output beams differing in the at least one beam characteristic. The beam characteristic(s) may include or consist essentially of wavelength or polarization or both wavelength and polarization.

Embodiments of the invention may include one or more of the following in any of a variety of combinations. The combined beam may be amplified with an amplifier having a line width less than the line width of the combined beam, thereby suppressing Brilliouin scattering in the amplifier. One of the two final output beams may be discarded. One of the two final output beams may be directed to a printing cylinder of a plateless lithographic printing system to create an image thereon. The seed lasers may have different rise times, and operating the seed lasers may include staggering electrical signals thereto, such that the combined beam has substantially constant power as a function of time. Separating the combined beam may include or consist essentially of directing the combined beam into a wavelength separator (e.g., a dichroic mirror, a polarization division demultiplexer, and/or a wavelength division demultiplexer). The seed lasers may be modulated at a random frequency corresponding to an incoming data stream.

In yet another aspect, embodiments of the invention feature a method of printing. A hydrophilic, ink-receptive lithographic surface having a printing area is provided. A polar liquid is applied to the printing area for adsorption thereon. The liquid-bearing printing area is exposed to a laser output in an imagewise fashion, the laser output substantially removing the adsorbed liquid without damaging the printing surface. Ink is applied to the printing area, the ink adhering to the surface only where the polar liquid has been removed by the laser output, and the ink is transferred to a recording medium. The imagewise laser output is applied at a frequency exceeding approximately 50 MHz and has a power ranging from approximately 10 W to approximately 100 W. The laser output may be produced with an apparatus including or consisting essentially of first and second seed lasers, a coupler, an amplifier, and a separator. The first and second seed lasers each emit an output beam differing in at least one beam characteristic. The coupler combines the output beams into a combined beam, and the amplifier increases the power of the combined beam, thereby forming an amplified beam. The separator separates the amplified beam into the laser output and a second laser output based on the beam characteristic(s). The line width of the amplifier may be less than the line width of the combined beam, whereby Brilliouin scattering is suppressed in the amplifier. The beam characteristic(s) may include or consist essentially of wavelength or polarization or both wavelength and polarization. The first and second seed lasers, the coupler, the amplifier, and the separator may be all fiber-coupled.

In a further aspect, embodiments of the invention feature a method of printing. A hydrophilic, ink-receptive lithographic surface having a printing area is provided. Ink is applied to the printing area for adsorption thereon. The ink-bearing printing area is exposed to a laser output in an imagewise fashion, the laser output fixing the adsorbed ink on the printing surface. A polar liquid is applied to the printing area, the polar liquid removing ink that has not received laser exposure, and the remaining ink is transferred to a recording medium. The imagewise laser output is applied at a frequency exceeding approximately 50 MHz and has a power ranging from approximately 10 W to approximately 100 W. The laser output may be produced with an apparatus including or consisting essentially of first and second seed lasers, a coupler, an amplifier, and a separator. The first and second seed lasers each emit an output beam differing in at least one beam characteristic. The coupler combines the output beams into a combined beam, and the amplifier increases the power of the combined beam, thereby forming an amplified beam. The separator separates the amplified beam into the laser output and a second laser output based on the beam characteristic(s). The line width of the amplifier may be less than the line width of the combined beam, whereby Brilliouin scattering is suppressed in the amplifier. The beam characteristic(s) may include or consist essentially of wavelength or polarization or both wavelength and polarization. The first and second seed lasers, the coupler, the amplifier, and the separator may be all fiber-coupled.

In another aspect, embodiments of the invention feature a printing apparatus including or consisting essentially of a hydrophilic, ink-receptive lithographic surface having a printing area, means for applying a polar liquid to the printing area for adsorption thereon, means for exposing the liquid-bearing printing area to a laser output in an imagewise fashion, whereby the laser output substantially removes the adsorbed liquid without damaging the printing surface, means for applying ink to the printing area such that the ink adheres to the surface only where the polar liquid has been removed by the laser, and means facilitating transfer of the ink to a recording medium. The exposing means includes or consists essentially of first and second seed lasers, a coupler, an amplifier, and a separator. The first and second seed lasers each emit an output beam differing in at least one beam characteristic. The coupler combines the output beams into a combined beam, and the amplifier increases the power of the combined beam, thereby forming an amplified beam. The separator separates the amplified beam into the laser output and a second laser output based on the beam characteristic(s). The line width of the amplifier may be less than the line width of the combined beam, whereby Brilliouin scattering is suppressed in the amplifier. The beam characteristic(s) may include or consist essentially of wavelength or polarization or both wavelength and polarization. The first and second seed lasers, the coupler, the amplifier, and the separator may be all fiber-coupled.

In another aspect, embodiments of the invention feature a printing apparatus including or consisting essentially of a hydrophilic, ink-receptive lithographic surface having a printing area, means for applying ink to the printing area for adsorption thereon, means for exposing the ink-bearing printing area to a laser output in an imagewise fashion, whereby the laser output fixes the adsorbed ink on the printing surface, means for applying a polar liquid to the printing area to remove ink that has not received laser exposure, and means facilitating transfer of the remaining ink to a recording medium. The exposing means includes or consists essentially of first and second seed lasers, a coupler, an amplifier, and a separator. The first and second seed lasers each emit an output beam differing in at least one beam characteristic. The coupler combines the output beams into a combined beam, and the amplifier increases the power of the combined beam, thereby forming an amplified beam. The separator separates the amplified beam into the laser output and a second laser output based on the beam characteristic(s). The line width of the amplifier may be less than the line width of the combined beam, whereby Brillouin scattering is suppressed in the amplifier. The beam characteristic(s) may include or consist essentially of wavelength or polarization or both wavelength and polarization. The first and second seed lasers, the coupler, the amplifier, and the separator may be all fiber-coupled.

These and other objects, along with advantages and features of the invention, will become more apparent through reference to the following description, the accompanying drawings, and the claims. Furthermore, it is to be understood that the features of the various embodiments described herein are not mutually exclusive and can exist in various combinations and permutations. As used herein, the term "substantially" means±10%, and, in some embodiments, ±5%; in some contexts, "substantially" means with sufficient completeness that the visual quality or fidelity of a finished product, such as a printed sheet, is not impaired. The term "consists essentially of" means excluding other materials that contribute to function, unless otherwise defined herein.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1:
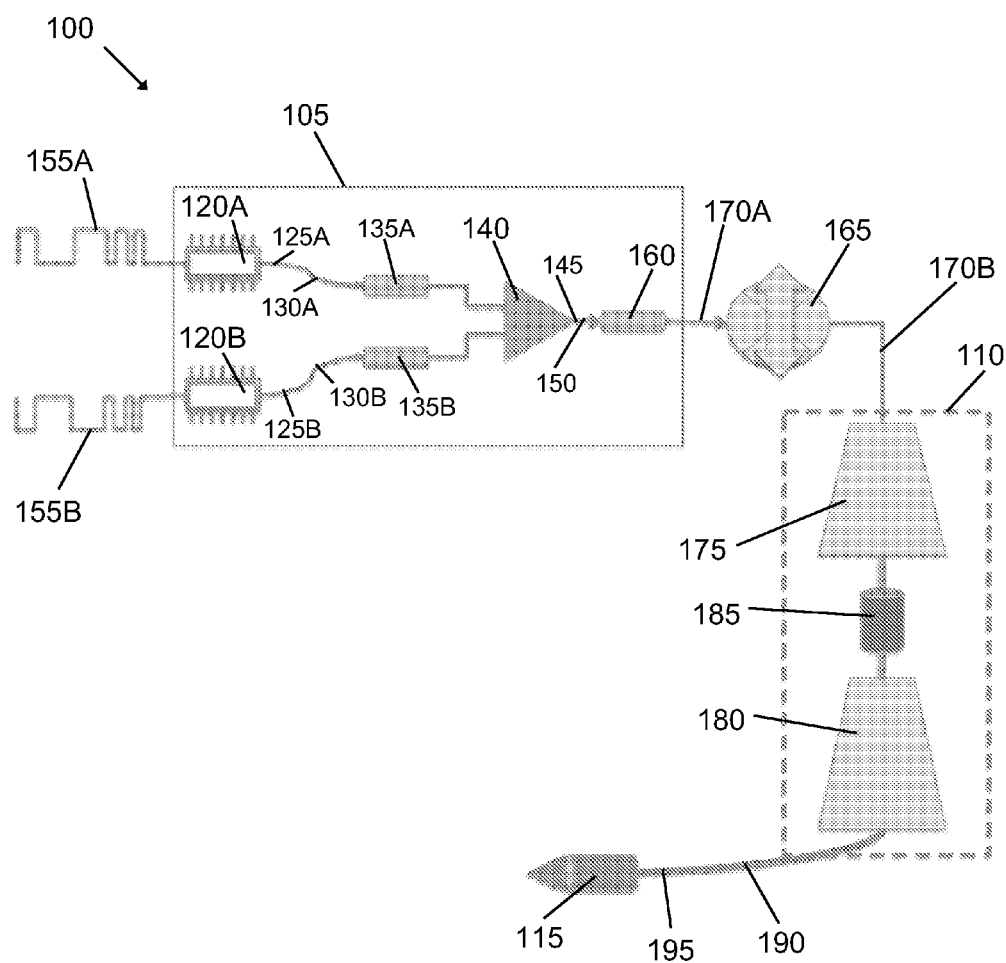
FIG. 1 schematically depicts a laser apparatus in accordance with embodiments of the invention.

FIG. 1 depicts a laser apparatus 100 that includes a combining stage 105, an amplifying stage 110, and a high-power output 115. As illustrated, the combining stage 105 features two seed lasers 120A, 120B, each of which emits a seed beam (labeled as 125A, 125B, respectively). Although the depicted embodiments utilize two seed lasers, embodiments utilizing more than two seed lasers are within the scope of the invention. Seed lasers 120A, 120B may be semiconductor diode lasers, and they emit output beams differing in at least one beam characteristic, e.g., wavelength and/or polarization. In a preferred embodiment, seed laser 120A emits at approximately 1064 nm, and seed laser 120B emits at approximately 1032 nm. In other embodiments, seed lasers 120A, 120B emit at approximately the same wavelength (e.g., 1064 nm) but have different polarizations, for example, substantially perpendicular polarizations. Seed lasers 120A, 120B are typically capable of emitting at approximately the same output power, and may be modulated at random frequencies averaging approximately 100 MHz to approximately 500 MHz. However, the output power of seed lasers 120A, 120B is itself insufficient for applications such as printing, cutting, or drilling, which typically require power levels of approximately 5-100 W. In an embodiment, the output power of seed lasers 120A, 120B is less than approximately 1 W, e.g., approximately 450 mW.

The seed beams 125A, 125B are each emitted into an optical fiber 130A, 130B, respectively, each of which is coupled to an isolator 135A, 135B, respectively. In general, the isolators 135A, 135B allow only one-way transmission of optical signals (e.g., seed beams 125A, 125B) therethrough. Thus, the isolators 135A, 135B substantially prevent the optical surge of seed beams 125A, 125B back into seed lasers 120A, 120B via back-reflection from and/or through downstream components (e.g., optical signal combiner 140 described below). Such optical surges may result in degradations in the performance of laser apparatus 100, or even result in significant damage to seed lasers 120A, 120B. In various embodiments, isolators 135A, 135B are low-power isolators having power-handling capacities of up to approximately 1 W. Isolators 135A, 135B also typically have low insertion losses ranging from, e.g., approximately 0.5 dB to approximately 1 dB. Isolators 135A, 135B may be polarization-independent (i.e., designed to pass optical signals regardless of polarization), e.g., if the polarizations of seed beams 125A, 125B are the same or not particularly selected, or polarization-dependent (i.e., passing only signals of predefined polarizations), e.g., if the polarizations of seed beams 125A, 125B are particularly selected and/or different, as described above.

Isolators 135A, 135B are coupled (preferably via optical fiber) into an optical signal combiner 140, which combines seed beams 125A, 125B into a single combined beam 145 exiting optical signal combiner 140 via optical fiber 150. In an embodiment, optical signal combiner 140 has a coupling loss (or an insertion loss) of less than approximately 3 dB, e.g., less than approximately 1.5 dB, or even less than approximately 1 dB. For example, optical signal combiner 140 may have an insertion loss ranging between approximately 0.3 dB and approximately 1.5 dB, or even ranging between approximately 0.3 dB and approximately 0.5 dB. Optical signal combiner 140 may be, e.g., a wavelength division multiplexer, which may be polarization-independent or polarization-dependent. The insertion loss of optical signal combiner 140 may be decreased through the use of, e.g., an integrated optical filter and/or fused coupling between optical fibers 130A, 130B and optical signal combiner 140. In other embodiments, optical signal combiner 140 is a polarization division multiplexer that is polarization-dependent but substantially wavelength-independent.

During operation of laser apparatus 100, seed lasers 120A, 120B are modulated in a complementary fashion by, e.g., one or more laser drivers (not shown). Specifically, in various embodiments, the laser driver(s) modulate the output of seed laser 120A at a frequency dictated by an incoming digital data stream, or signal, 155A, which may be random and which depends on the application. For example, seed laser 120A may emit input beam 125A with a frequency corresponding to the "1s" of a digital data stream representing text or graphics. Seed laser 120B is modulated complementarily to seed laser 120A, i.e., it emits at approximately the same output power when seed laser 120A is off (or emitting at a lower power), and is off (or emitting at a lower power) when seed laser 120A is emitting light. (As pictured, the laser driver(s) modulate the output of seed laser 120B at a frequency dictated by a signal 155B that is the complement of signal 155A.) In this manner, the combined beam 145 of seed lasers 120A, 120B has substantially constant power (as a function of time) and modulates in wavelength and/or polarization between the output wavelengths and/or polarizations of seed lasers 120A, 120B. The substantially constant power level of combined beam 145 facilitates the proper operation of amplifying stage 110 (and hence, the production of the desired, randomly modulated high-power laser beam suitable for, e.g., printing applications), as described below.

In an embodiment, seed lasers 120A, 120B have substantially similar rise times (i.e., the amount of time that elapses between receipt of the electrical signal from the laser driver(s) and emission of laser light at the desired power level), such that the laser driver(s) may directly modulate seed lasers 120A, 120B based upon the incoming data stream. In another embodiment, seed lasers 120A, 120B have different rise times, and the laser driver(s) "stagger" the driving signals 155A, 155B to seed lasers 120A, 120B such that the emitted optical signals therefrom are precisely aligned and combined beam 145 has a substantially constant power level.

Optical fiber 150 is coupled to an isolator 160, the output from which enters amplifying section 110. Like isolators 135A, 135B, isolator 160 substantially prevents the back-reflection (here of combined beam 145) from downstream components (e.g., components within amplifying stage 110), as such back-reflection may result in significant damage to optical signal combiner 140. Unlike isolators 135A, 135B, however, isolator 160 is significantly more resistant to the flow therethrough of optical power in the reverse (or "upstream") direction. In preferred embodiments, isolator 160 resists back-reflection of at least from approximately 1 W to approximately 5 W or approximately 10 W, or even up to at least approximately 40 W of optical power. Thus, isolator 160 is preferably completely resistant to surges of optical power resulting from Q-switching in amplifying section 110 (which may be caused by, e.g., Brillouin scattering or other non-linear optical phenomena). Isolator 160 may be a single-stage or multiple-stage isolator, and may provide more than approximately 30 dB of isolation (preferably up to, and even greater than, approximately 60-65 dB of isolation). Isolator 160 may also be polarization-dependent or polarization-independent (in embodiments in which seed beams differ only or primarily by polarization, a polarization-dependent isolator 160 is preferred). In a specific embodiment, overall insertion losses are minimized by utilizing a multiple-stage isolator 160 featuring a first stage having up to approximately 30 dB of isolation and a second stage (downstream from the first) having up to approximately 40 dB of isolation. Isolator 160 typically includes or consists essentially of a high-power Faraday rotator and high-strength magnetic elements to prevent higher amounts of power surging backward therethrough. While isolator 160 is preferably fiber-coupled, isolator 160 is not fiber-coupled in some embodiments of the invention.

Isolator 160 is coupled to amplifying stage 110, which amplifies combined beam 145 in one or more stages. Isolator 160 may be fiber coupled directly to amplifying stage 110, or, as shown in FIG. 1, combined beam may travel through a resonant phase modulator 165 before reaching amplifying stage 110. Resonant phase modulator 165 may be fully in-line fiber coupled to both isolator 160 and amplifying stage 110. In other embodiments, combined beam 145 travels from isolator 160 through an optical fiber 170A fiber coupled thereto, through resonant phase modulator 165, and through an optical fiber 170B fiber coupled to amplifying stage 110; optical fibers 170A, 170B are free-space coupled to resonant phase modulator 165 via collimating optics (not shown). The collimating optics may include angled input and output optical ferrules to prevent back-reflection of combined beam 145 (or a portion thereof). In an embodiment, the output face of the ferrule has an approximately 8° angle. Furthermore, a high-precision alignment mount having three-point kinematic mounts may be utilized to facilitate alignment of combined beam 145 into and out of resonant phase modulator 165.

Resonant phase modulator may be capable of handling low optical power (e.g., approximately 0.01 to approximately 100 mW) or high optical power (e.g., up to approximately 5-6 W), depending on the size of combined beam 145 and the type of coupling. The insertion loss attributable to resonant phase modulator 165 may be very low (e.g., approximately 0.01—approximately 2 dB), especially for free-space coupled variants, or may be slightly higher (e.g., approximately 3—approximately 6 dB). In various embodiments, resonant phase modulator 165 broadens the optical spectrum of combined beam 145 in order to minimize or eliminate any impact of Brillouin scattering within apparatus 100 (as also detailed below). For example, resonant phase modulator 165 may increase the line width of combined beam 145 to the MHz, or even the GHz, range.

Fiber 170B (either via resonant phase modulator 165 or directly from isolator 160) is coupled to amplifying stage 110, which, as mentioned above, includes one or more amplifiers (e.g., fiber amplifiers) that amplify combined beam 145 to a high power level, e.g., ranging from approximately 10 W to approximately 100 W, depending upon the power desired. Typically, fiber amplifiers operate properly only with incoming beams of constant power. For an incoming beam having a randomly modulated power level, the amplifier may exhibit instability after long "off" states: when the amplifier experiences an "on" state after a lull in the signal, the amplifier output may deleteriously spike and/or exhibit noise or irregularities. Thus, embodiments of the invention enable high-power randomly modulated laser outputs from a fiber amplifier by representing the data stream by modulations in the wavelength and/or polarization rather than power, instead keeping the power of combined beam 145 constant. In this manner, amplifying stage 110 amplifies combined beam 145 to the desired power level without introducing noise into the data stream.

Amplifying stage 110 may include one or more amplifiers, as mentioned above. As shown in FIG. 1, optical fiber 170B is coupled to an amplifier 175, which is fiber coupled to a second amplifier 180 with an inter-stage isolator 185 therebetween. Typically, for desired final amplified powers of up to approximately 10 W, amplifying stage 110 includes only a single amplifier (e.g., amplifier 175), while embodiments for higher-power applications (e.g., up to approximately 40 W, or even more) incorporate at least two amplifiers. Inter-stage isolator 185, like isolators 135A, 135B, and 160, substantially prevents the back reflection of the optical beam. In the embodiment of FIG. 1, inter-stage isolator 185 is a high-power isolator (e.g., capable of handling optical powers of at least 10 W), which prevents damage to amplifier 175 in the event of a non-linear event (e.g., Q switching) within amplifier 180. Inter-stage isolator 185 may include, e.g., one or more Faraday rotators and/or other polarizing elements.

In various embodiments, amplifiers 175, 180 may be optically pumped by diode lasers, as is conventional in the art. Amplifiers 175, 180 may be glass (e.g., a silicate glass) fibers doped with one or more types of laser-active rare-earth ions, such as neodymium, ytterbium, erbium, thulium, praseodymium, and/or holmium. The fibers may include a core surrounded by one or more cladding layers for containing the laser beam within the core. The rare-earth ions may be present only in the core of the fibers.

Since various embodiments of the invention are substantially (e.g., completely except for into or out of resonant phase modulator 165) or fully fiber-coupled, they are typically vulnerable to Brilliouin scattering within one or more of the amplifiers, since typical diode lasers have very narrow line widths of approximately 1 kHz or even less. (Brilliouin scattering, references to which herein are understood to include stimulated Brilliouin scattering, typically does not occur in laser systems that are not fiber-coupled, i.e., which guide light with bulk optics, because the laser radiation undergoes refraction, reflection, and/or divergence at the optic-air interfaces; such light generally does not interact with acoustic phonons and has lower power densities.) Thus, in preferred embodiments, the line width of one or more of the amplifiers 175, 180 is less than the line width of the seed lasers 120A, 120B (which is related to and proportional the spectral width of the seed lasers 120A, 120B) in order to substantially suppress, or even eliminate, Brilliouin scattering within apparatus 100 (e.g., within amplifiers 175, 180). For example, the line width of seed lasers 120A, 120B may be increased (e.g., to approximately 100 kHz to the MHz range) via operating the seed lasers in a pulsed mode (e.g., at frequencies in the nanosecond or picosecond range). Alternatively, seed lasers 120A, 120B may be operated in continuous-wave mode but with an in-line Fiber Bragg Grating (FBG) that broadens the peak of each seed laser to a line width of approximately 100 kHz up to 100 MHz, or even larger. In other embodiments, seed lasers 120A, 120B incorporate curved or tilted waveguide ridges that suppress back reflections and promote spectral broadening, as described in E. A. Zibik, et al., "Novel single-mode fiber coupled broadband seed source for pulsed fiber laser systems," Proc. SPIE, Vol. 7616, 76161K (2010), the entire disclosure of which is incorporated by reference herein.

Figure 2:
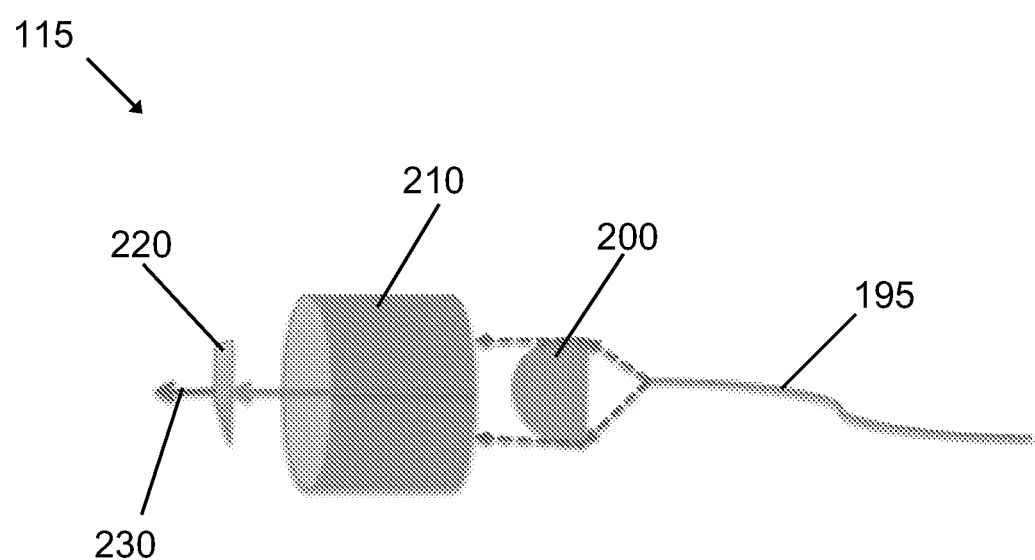
FIG. 2 is an exploded enlarged view of the high-power output of the laser apparatus of FIG. 1, in accordance with embodiments of the invention.

After amplification, an amplified output beam 190 emerges from amplifying section 110 via an optical fiber 195 and travels to high-power output 115. The beam quality of amplified output beam 190 may be near-ideal, ranging from approximately 1.1 to approximately 1.5. As shown in FIG. 2, in various embodiments, high-power output 115 includes a collimator 200, an isolator 210, and a filter 220, each of which may be fiber-coupled or free-space-coupled. Collimator 200 generates the final beam diameter of output beam 230, parallelizing and increasing the size of the amplified beam within optical fiber 195 by up to approximately 1000 times, depending upon the requirements for output beam 230. In an embodiment, collimator 200 enlarges the size of the beam from the size of the diameter of the core of fiber 195 (e.g., approximately 1-approximately 50 microns) to a final size of, e.g., approximately 1-approximately 10 mm. Collimator 200 may include or consist essentially of one or more lenses and/or spherical or aspherical elements, as known in the art.

The increase in beam diameter of the amplified beam by collimator 200 typically decreases its power density by, e.g., several orders of magnitude, thereby substantially preventing any damage to isolator 210. Like inter-stage isolator 185, isolator 210 is capable of isolating high optical power levels of, e.g., at least approximately 10 W-approximately 40 W, or even more. Isolator 210 may be polarization-dependent or polarization-independent, depending upon the wavelengths and/or polarizations of seed beams 125A, 125B. Isolator 210 (as well as the other isolators described previously) may be a Faraday-effect optical isolator, and/or may operate at wavelengths centered around a wavelength of approximately 1064 nm.

After exiting amplifier stage 110, amplified output beam 190 has a substantially constant power level ranging from approximately 10 W to approximately 100 W, and has encoded within it the desired data stream via random modulations in wavelength and/or polarization. In an embodiment, the wavelength and/or polarization of amplified output beam 190 modulates between the wavelengths and/or polarizations emitted by seed lasers 120A, 120B, as described above. In order to produce a final output beam 230 having high power that is modulated in intensity (i.e., power), amplified output beam 190 is directed through filter 220, which splits the amplified output beam 155 into two beams, each corresponding to one wavelength (or polarization) emitted by seed lasers 120A, 120B. In an exemplary embodiment, the portion of the amplified output beam 190 corresponding to the wavelength or polarization of seed laser 120A passes through filter 220, thus becoming the final output beam 230 usable in applications such as graphic-arts imaging, printing, drilling, and cutting. Final output beam 230 has substantially the same power as amplified output beam 190, i.e., a power level ranging between approximately 10 W and approximately 100 W, depending on the requirements of the application and the gain of amplifier section 110.

In various embodiments, the portion of the amplified output beam 190 corresponding to the wavelength or polarization of seed laser 120B is either absorbed within high-power output 115 or emitted and deflected away into a beam dump (not shown) and discarded. The beam dump may be a tube of, e.g., anodized aluminum or other thermally conductive material, which absorbs the energy of the "rejected" output beam and conducts away the resulting heat. In other embodiments, this second output beam, as it contains the same information as final output beam 230 (albeit in "negative" form) is itself utilized in parallel with final output beam 230 for, e.g., imaging, printing, drilling, or cutting.

Filter 220 may be, e.g., a dichroic mirror or a wavelength (and/or polarization) division demultiplexer, which should be selected in conjunction with the wavelengths and/or polarizations of seed beams 125A, 125B to ensure proper separation of the combined beam. In an embodiment, the difference in wavelengths of seed beams 125A, 125B is large enough such that the combination of the two may be efficiently separated by filter 220, but small enough such that amplifier section 110 effectively amplifies both wavelengths. In a preferred embodiment, the emission wavelength difference ranges from approximately 9 nm to approximately 100 nm. Filter 220 may be tuned based on the spectral outputs of seed lasers 120A, 120B. In various embodiments, high-power output 115 features collimator 200, isolator 210, and filter 220 in different configurations than that shown in FIG. 2. For example, amplified output beam 190 may first travel through filter 220 before being collimated and isolated, and other configurations are possible.

High-power output 115 may also include, in some embodiments, a harmonic generator that multiplies the frequency of amplified output beam 190, resulting in a final output beam 230 having a frequency larger than that of amplified output beam 190 by a factor of two, three, four, or even more. For example, an amplified output beam 190 having a wavelength of approximately 1064 nm may be converted, via the harmonic generator, to a final output beam 230 having a wavelength of approximately 532 nm, approximately 353 nm, approximately 266 nm, or even lower. Such harmonic generators typically include one or more non-linear crystal materials such as lithium niobate, nearly stoichiometric-periodically poled magnesium oxide: lithium tantalate (with single grating or fanout grating), potassium titanyl phosphate, potassium niobate, lithium triborate, cesium lithium borate, β-barium borate, bismuth triborate, cesium borate, yttrium calcium oxyborate, strontium beryllium borate, lithium triborate, zinc germanium diphosphide, silver gallium sulfide and selenide, gallium selenide, cadmium selenide, and/or gallium arsenide.

Figure 3:
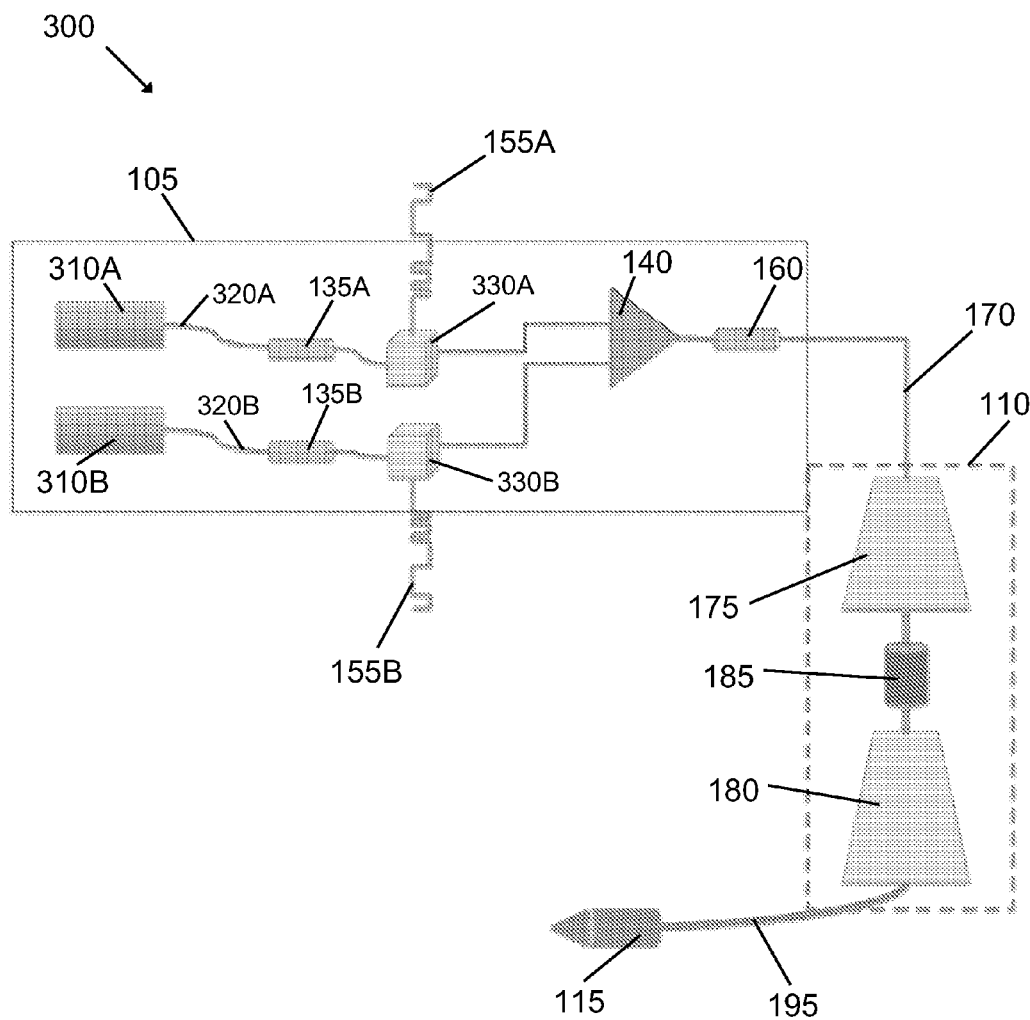
FIG. 3 schematically depicts a laser apparatus in accordance with various alternative embodiments of the invention.

FIG. 3 depicts an alternative embodiment of the present invention, namely a laser apparatus 300 in which combining stage 105 features two (although more may be utilized) seed lasers 310A, 310B. Seed lasers 310A, 310B may be, e.g., fiber lasers, and may be operated in continuous wave mode. Like seed lasers 120A, 120B, seed lasers 310A, 310B each emit at a different wavelength and/or polarization. In a preferred embodiment, seed laser 310A emits at approximately 1064 nm, and seed laser 310B emits at approximately 1080 nm. In other embodiments, seed lasers 310A, 310B emit at approximately the same wavelength (e.g., 1064 nm) but have different polarizations, for example, substantially perpendicular polarizations. Seed lasers 310A, 310B are typically capable of emitting at approximately the same output power; however, the output power of seed lasers 310A, 310B is itself insufficient for applications such as printing, cutting, or drilling, which typically require power levels of approximately 10-100 W. In an embodiment, the output power of seed lasers 310A, 310B is less than approximately 1 W, e.g., approximately 450 mW.

Unlike seed lasers 120A, 120B depicted in FIG. 1, seed lasers 310A, 310B are not themselves directly modulated in response to signals 155A, 155B. Rather, after the seed beams 320A, 320B (emitted by seed lasers 310A, 310B, respectively) travel through isolators 135A, 135B, they are modulated by modulators 330A, 330B prior to being combined by combiner 140. Each of modulators 330A, 330B may be, e.g., an acousto-optic modulator or an electro-optic modulator, and may include one or more optical drivers. Modulators 330A, 330B modulate the wavelength and/or polarization of seed beams 320A, 320B in response to complementary signals 155A, 155B (at, e.g., random frequencies averaging approximately 100 MHz to approximately 500 MHz). For example, one or more of modulators 330A, 330B may be an acousto-optic modulator featuring one or more Bragg cells, through which the seed beams 320A, 320B travel, the refractive indices of which may be modified via oscillating mechanical pressure (e.g., sound waves) induced in response to signals 155A, 155B. Such modulators 330A, 330B may include or consist essentially of materials such as tellurium dioxide, crystalline quartz, and/or fused silica. In another exemplary embodiment, one or more modulators 330A, 330B is an electro-optic modulator featuring one or more Pockels cells, through which the seed beams 320A, 320B travel, the refractive indices of which may be modified via oscillating electrical fields induced in response to signals 155A, 155B. Such modulators 330A, 330B may include or consist essentially of potassium di-deuterium phosphate, potassium titanyl phosphate, beta-barium borate, lithium niobate, lithium tantalate, and/or ammonium dihydrogen phosphate. Once modulated, the seed beams 320A, 320B are combined and amplified as detailed above with reference to FIG. 1.

Final output beam 230 of laser apparatus 100 (and/or laser apparatus 300) may be advantageously utilized in a variety of applications benefiting from the availability of a high-power, randomly modulated laser. One example is plateless lithographic printing, as detailed below and in the '838 application, as well as other graphic-arts applications including laser imaging. Other applications include various materials processing methods, including laser engraving, laser drilling, and laser cutting.

Plateless Lithographic Printing

Figure 4:
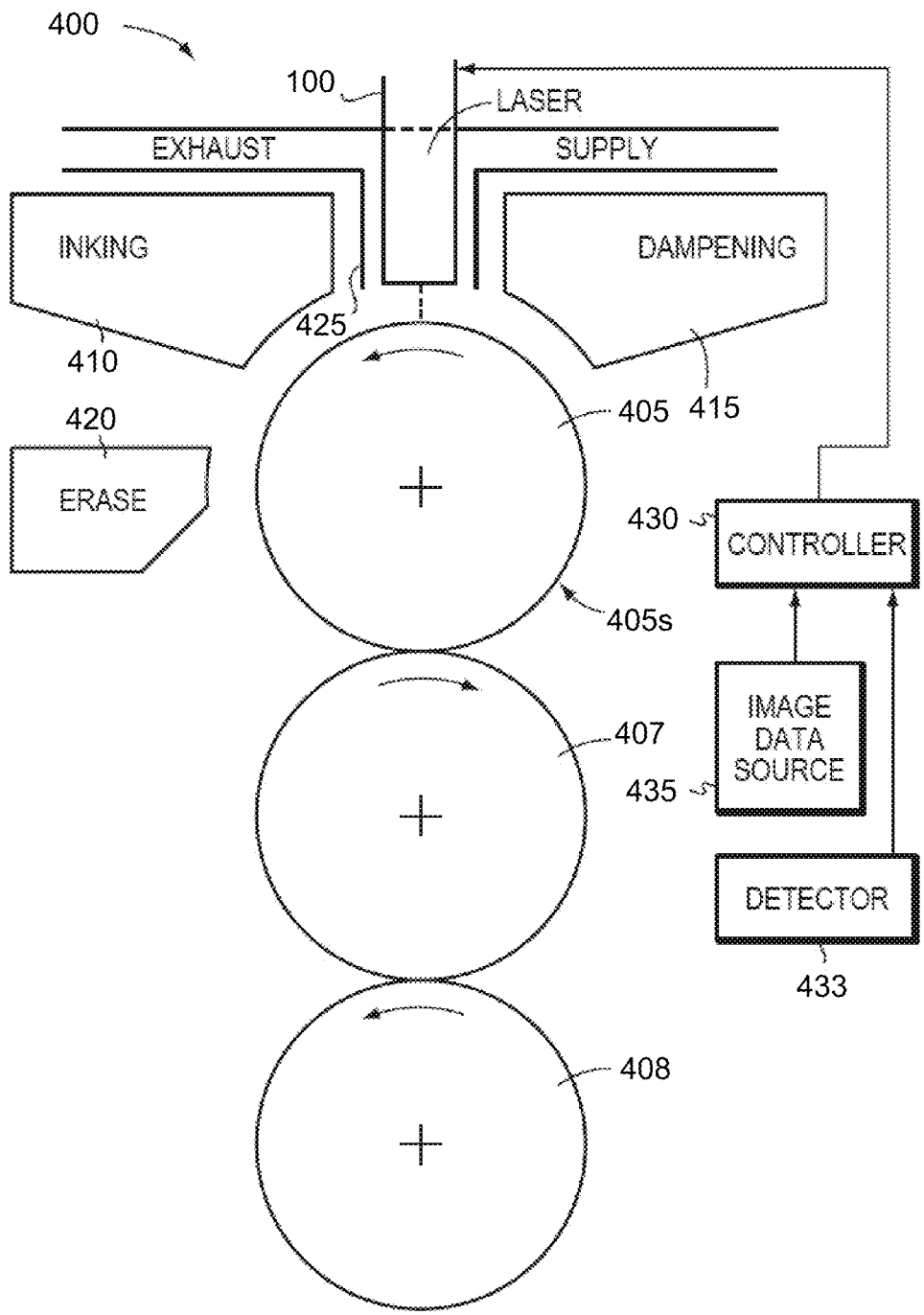
FIG. 4 schematically illustrates a representative imaging and printing configuration suitable for implementing embodiments of the present invention.

Referring now to FIG. 4, in general overview, a printing press 400 in accordance with embodiments of the invention may include a print cylinder 405 having a lithographic surface 405s. Cylinder 405 rotates in contact with a compliant blanket cylinder 407, and this cylinder, in turn rotates in contact with an impression cylinder 408. Recording media (e.g., paper) in sheet form passes through the nip n between cylinders 407, 408 before being discharged to the exit end of the press 400. Typically, cylinders 405, 407, 408 are geared together and driven in unison by a single drive motor.

Ink for inking cylinder 405 is delivered by an ink train 410, the outermost roll of which is in rolling engagement with cylinder 405 when press 400 is printing. A dampening system 415 applies a polar liquid, e.g., an aqueous medium such as dampening or fountain solution, to the lithographic surface 405s of print cylinder 405. The output(s) of laser apparatus 100 selectively strike surface 405s in an imagewise fashion, either removing (e.g., ablating or vaporizing), on a point-by-point basis, dampening solution from the surface or fixing previously applied ink so as to resist removal. (Hereinbelow, all references to laser apparatus 100 are understood to include other embodiments of the invention such as laser apparatus 300). In ink-first embodiments, laser apparatus 100 "dries" the ink to a quasi-stable state; once set, the exposed ink regions will be more resistant to removal by dampening. In dampening-first embodiments, the unremoved polar liquid corresponds to the background regions and resists ink. In all cases, the laser output beam 230 is sufficiently powerful to exert the desired effect but without damaging surface 405s; by "damage" is meant a change to native lithographic affinity that would interfere with the function of the printing surface.

An erasing unit 420 may be included to ensure complete removal of ink prior to a succeeding print cycle. Thus, in dampening-first embodiments, erasing unit 420 may remove residual ink if a post-transfer application of dampening fluid by dampening system 415 is inadequate for this purpose; and in ink-first embodiments, erasing unit 420 may apply an ink-removal fluid to effectively remove the fixed ink from surface 405s. Suitable ink-removal fluids include conventional compositions for cleaning lithographic printing plates. Commonly, the blend is predominantly high-boiling (low vapor pressure) hydrocarbon solvents, but includes a low level of more active (polar) solvents and can include hydrocarbon-soluble surfactants to improve suspension of particulates (pigment particles, etc.). One preferred cleaning composition is an alkaline solvent-in-water emulsion, typically containing ±30% petroleum distillates, emulsifying surfactants and a few percent of an alkaline additive. NaOH, KOH, Na silicates and K silicates are examples of commonly used additives, individually or in combination, to provide alkalinity. GREAT PLATES, supplied by Tower Products (Palmer, Pa.), is a commercial example.

It may also be desirable to include a debris-management system 425, which may surround the writing head on which laser apparatus 100 is mounted. System 425 minimizes vapor plumes that may result from the imaging process and contaminant build-up on optical components. Debris plumes are a well-known phenomenon that can cause lens surface deposits (which, in turn, results in beam blocking and localized overheating) and beam occlusion in laser-ablation systems for various kinds of imaging, e.g., lithographic plates, flexographic rolls and gravure (anilox) cylinders, and debris-management systems for addressing the problem are conventional. The system 425 has supply and exhaust manifolds. An air source, coupled to the supply manifold, provides purge air to displace the debris plume. For particularly sensitive systems, the purge air may need to be humidity and temperature controlled. An exhaust system, coupled to the exhaust manifold, removes air entraining the debris plume. Typically, the exhaust flow rate is slightly higher than that of the purge air so that air pressure in the region under management is slightly negative relative to that of the surrounding area, resulting in flow toward the exhaust. (A positive air pressure relative to the surrounding area will push air entraining the debris plume away from the exhaust system and into the surrounding area.) The system 425 may also include a "scrubber" to clean the exhausted air, depending on what is identified to be in the exhaust. This capability is particularly desirable if the exhausted air is vented into the working environment (e.g., press room) rather than to the exterior of the building.

The surface 405s is hydrophilic and ink-receptive. By "hydrophilic" is meant the ability to retain, in the presence of an applied force, an adsorbed layer of fluid to which ink will not adhere. In general, a hydrophilic surface in accordance herewith will preferentially retain the adsorbed layer of fluid relative to ink when both the fluid and ink are on the surface in the presence of an applied force. A metal surface 405s—either the surface of the cylinder 405 itself, or a metal surface layer or sheet (typically having a thickness of 0.02 inch or less) applied to the cylinder 405—such as titanium is preferred. Six-mil titanium sheets, wrapped around a conventional print or offset cylinder and cleaned to remove milling lubricants, have been employed to advantage and are particularly suited to small-format presses; thicker sheets may be preferred in removable sleeve embodiments as described below, or for larger-format presses. In addition, physical surface modification (e.g., imparting a controlled surface roughness and/or chemical modification of the surface) can be used to enhance the performance of titanium sheets. Such modifications can be imparted using techniques well known in the art for conventional metal finishing.

Printing techniques in accordance with the invention are desirably compatible with routinely available lithographic printing inks. Laser sensitizers, while not necessary to performance, may nonetheless be utilized to optimize or fine-tune ink behavior. A wide range of sensitizers may be employed, e.g., inorganic pigments such as the relatively transparent conductors ITO, $V_xSn_{(1-x)}O_2$ and $Sb_xSn_{(1-x)}O_2$; and/or organics such as pigments or dyes (e.g., metal chelates for lasers operating at≈1.5 µm).

Embodiments of the invention may accommodate separate or integrated dampening approaches, the latter referring to dampening fluid and ink applied simultaneously from a single assembly. Conventional oil-based or single-fluid inks may be employed. Single-fluid inks include water or a polar solvent as a separate phase incorporated into the ink that separates upon application to produce a dampening fluid. The specifics of separation are not a factor as the effect is essentially equivalent to an integrated dampening approach.

In one printing mode, a polar liquid such as fountain or dampening solution is initially applied by dampening system 415 to the entire printing surface 405s. The output of laser apparatus 100 (i.e., output beam 230) is selectively applied to the surface 405s in an imagewise fashion as described below. The laser output substantially removes the adsorbed liquid without damaging the printing surface 405s. Ink is then applied thereover by inking system 410. The ink adheres to the surface 405s only where the polar liquid has been removed by the laser apparatus 100, and is thereupon transferred to a recording medium passing through the nip n.

It is found that the color of the ink does not significantly influence the imaging process. Cyan, magenta, yellow and black inks, for example, dry under laser exposure, suggesting that significant laser absorption is provided by the metal sheet or cylinder. This can reduce or eliminate the need for inks that include laser absorbers (sensitizers).

In another printing mode, ink rather than a polar liquid is initially applied to the cylinder 405, and is adsorbed onto the printing surface 405s. The ink-bearing printing area is exposed to the output of laser apparatus 100 (i.e., output beam 230) in an imagewise fashion, thereby fixing the adsorbed ink on the printing surface 405s in the exposed regions. The polar liquid is applied to the printing area by dampening system 415 to remove ink that has not received laser exposure, and the remaining ink is transferred to a recording medium passing through the nip n.

Following ink application, the printing area may be erased by hand wiping or application of a polar or ink-removing liquid; the application, exposure and transferring steps may then be repeated using the same or different printing data. Furthermore, the application and exposure steps may be repeated more than once in a given printing cycle in order to intensify the ink image for printing. In particular, depending on various factors (most notably the nature of the applied ink), the process may not produce a printable image when laser exposure (imaging) is limited to a single revolution of the plate cylinder 405. This can occur with lithographic printing inks that flow too slowly to build enough mass from a single application. It may, for example, require two or more passes to build enough ink to establish an equilibrium flow from the inking system 410 to the recording medium.

The image is temporary and may be removed. Convenient erasability may result from inclusion, in typical lithographic inks, of a high-boiling-point solvent component (commonly referred to as an "ink oil") that contributes to "quick set"—i.e., a rapid gelling that results from the solvent component migrating into the print sheet combined with restructuring of the ink as it leaves the high-shear application and transfer environment. Laser exposure may result in evaporation of this solvent component from the ink being picked during repeated revolutions past the laser apparatus 100. However, what can be dried can also be rewet if drying does not result in an irreversible change, e.g., coalesced dispersions or loss of a volatile solubilizing component. Accordingly, repeated application of fresh ink to the ink initially set in place ("dried") on cylinder 405 will rewet the previously applied ink as the solvent component of the fresh ink partitions itself between the fresh ink and the underlying "dry ink" image feature. The result is a softening image feature that erodes over time (becoming easier to remove); an image feature that is dry rather than cured to a durable state will be easier to remove (erase) at any point in the process.

Print Cylinder

Figure 5A:
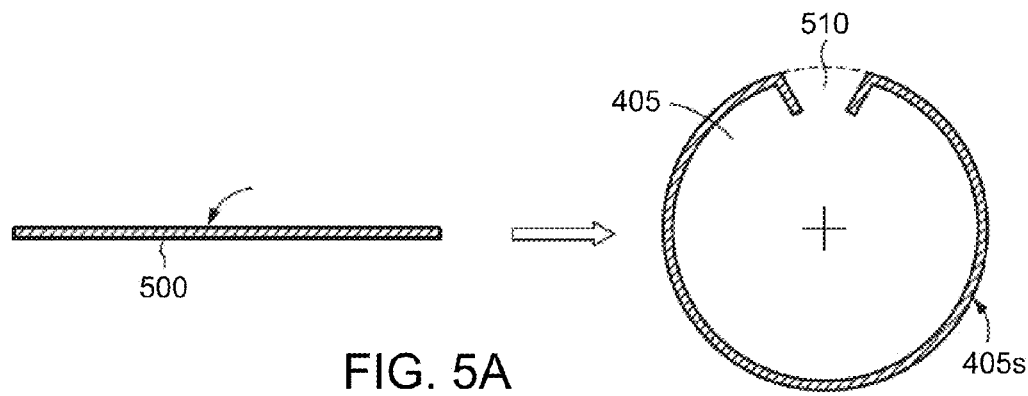
FIGS. 5A-5C schematically illustrate different cylinder configurations in accordance with embodiments of the invention.
Figure 5B:
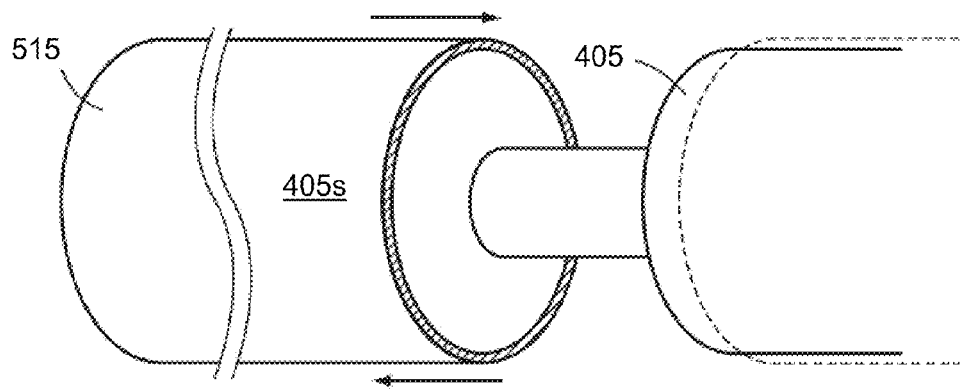

As noted above, metal surface 405s may be the surface of the cylinder 405 itself, or a metal surface layer or sheet (typically having a thickness of 0.006 inch or less) applied thereto. For example, as shown in FIG. 5A, a titanium sheet 500 may be wrapped around cylinder 405 and its edges crimped securely over the edges in a gap 510 in cylinder 405. Alternatively, as shown in FIG. 5B, the metal may take the form of a sleeve 515, which slides over cylinder 405. The sleeve 515 may be secured to cylinder 405 by clamps or other suitable engagements.

Figure 5C:
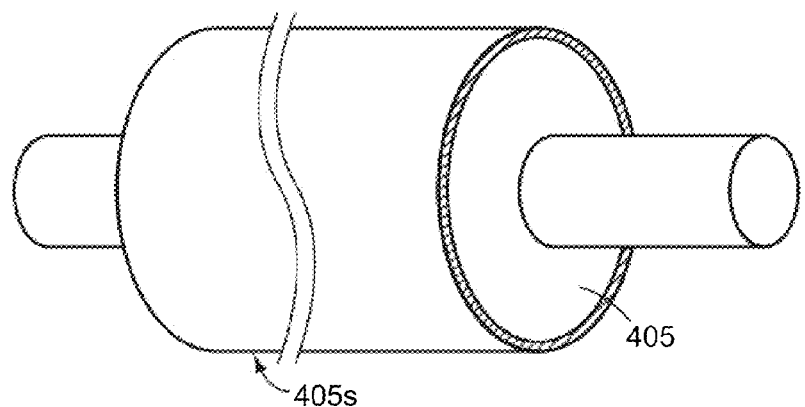

In still another alternative, illustrated in FIG. 5C, the cylinder 405 is itself fabricated from the metal whose surface 405s is presented on the exterior.

Inking System

The inking system 410 has four basic functions: to move ink from an ink fountain to the lithographic surface 405s; to break down a thick charge of ink into a thin uniform film; to work the ink into printing condition; and to remove image repeats on the form from previous printing cycles.

A representative inking system for a sheet-fed press in accordance with the invention has a series of rollers (typically on the order of ten) and includes an ink fountain (i.e., a pan that contains the ink supply); a ductor or ductor roller (i.e., a transfer roller that alternately contacts the ink fountain roller and the first roller of the ink train); form rollers (i.e., the last rollers of the ink train, usually having different diameters) that apply the ink to lithographic surface 405s; and, in some embodiments, an oscillator or vibrator (i.e., one or more gear- or chain-driven rollers that not only rotate but oscillate from side to side). In addition, inking system 410 may include intermediate rollers, i.e., friction- or gravity-driven rollers between the ductor and form roller(s) that transfer and condition the ink. These are often referred to as "distributors" if they contact two other rollers or "riders" if they contact a single roller (such as an oscillator). This "roller train" typically includes both hard and soft rollers.

A relatively long roller train is necessary in connection with sheet-fed offset inks useful in accordance with embodiments of the invention. These inks are both thixotropic and pseudoplastic, the latter property causing the initially large apparent viscosity to be greatly reduced under the shear provided by the rollers. The apparent viscosity decreases with time under a constant shear rate and also decreases with increasing shear rate. Suitable products include the sheet-fed inks available from Flint Ink (Flint Group) under the ARROWSTAR and K+E names; the REFLECTA and ALPHA VEG products marketed by Hostmann-Steinberg (Huber Group); and the LIBERTY and SPRINT inks marketed by Kohl & Madden (Sun Chemical Group).

The hard rollers are usually steel covered with copper, ebonite or nylon. The soft rollers (ductor, intermediate and form) are typically synthetic rubber or other polymer; they may be PVC (polyvinl chloride), Buna-N (copolymer of butadiene and acrylonitrile) or polyurethane.

More specifically, the ink is formed by the fountain roller (a metal roller that turns intermittently or continuously); a fountain blade, which may be a spring steel plate, steel segments or plastic approaching the fountain roller at an angle; and two fountain cheeks, which are vertical metal pieces that contact the fountain roller edges. As the fountain roller turns, the majority of the ink is held back by the blade, which is very close to the fountain roller. The distance between the blade and fountain roller is determined by the fountain keys, which can be adjusted to control the amount of ink delivered to different areas of the cylinder.

The ductor roller—the first roller in the train—feeds a metered amount of ink from the fountain to the inking system by alternately contacting the fountain roller and the first oscillator. A properly timed ductor roller contacts the oscillator when the form rollers are in the cylinder gap. This negates the effect of ductor shock, i.e., the vibration sent through the system when the ductor first contacts the oscillator. The oscillators accept ink from the ductor, passing it onto the remaining rollers in the train where the ink is worked down to a smooth film. An inking system may have several oscillators (also called drums or vibrators) which are usually made of steel tubing covered with copper, ebonite, nylon or some other oil receptive material. They move laterally (side to side) at least once every revolution of the cylinder. This smoothes out the ink film and reduces banding.

The distributors are resilient rollers that carry the ink from one oscillator to another, and are driven by surface friction contact with oscillators. Riders are hard rollers that make contact with only a single roller and do not transfer ink; they help condition the ink by increasing the ink path and collect debris such as paper fiber and dried ink. The form rollers are resilient rollers that contact the cylinder. These usually have different diameters to reduce mechanical ghosting (i.e., ghost images appearing in the printed image due to uneven ink take-off from the form rollers). They lift off from the cylinder when the press is idling.

Another suitable approach to inking is the ANICOLOR system, a "short" zoneless inking unit, marketed by Heidelberg.

Dampening System

The dampening system 415 applies a polar liquid to the cylinder 405 before it is inked. This keeps the non-image area moistened so that it will not accept ink. Gum in the fountain solution adsorbs on the non-image area of surface 405s to keep it water-wet. The gum does not adsorb on the image area which is not water-wet; this area is generally oil-wet. A concentrate used to mix a fountain solution is called fountain concentrate, fountain etch or simply etch. These usually contain Gum Arabic or synthetic gums for desensitizing. Most dampening solutions are acidic (pH 4-5) because the gum performs best under acid conditions. A commercial dampening solution may also include corrosion inhibitors to prevent reactions with the cylinder; a pH buffer; wetting agents such as isopropanol or its substitutes; a fungicide to prevent mildew and the growth of fungus and bacteria in the dampening system; and/or an antifoaming agent facilitate even distribution of dampening solution. Some concentrates may require added alcohol in addition to water. It should be noted, however, that polar liquids other then dampening fluids (e.g., plain water) may also be employed.

Suitable dampening solutions include UNIVERSAL PINK, marketed by Day International (Flint Group); the RYCOLINE, GREEN DIAMOND and LIBERTY products from Sun Chemical Group; and DIRECT FLUID, marketed by Hostmann-Steinberg (Huber Group).

The effectiveness of the dampening solution may depend on the local water supply. Hard water generally requires stronger acid than soft. To assure the most consistent performance, it is preferable to use distilled or deionized water. The cylinder-wetting characteristics depend in part on the surface tension of dampening solution, and this is reduced by both the gum (surfactant) and the alcohol (co-surfactant). The alcohol also increases the viscosity of the dampening solution, allowing a thicker layer of dampening solution to be applied to the nonimage area of the cylinder. Alcohol evaporates faster than water, limiting the amount of dampening solution that reaches the paper, and also reduces the tendency of ink to emulsify into the dampening solution.

Dampening systems are classified according to whether the water flow is intermittent or continuous, and whether cloth form rollers are employed to transfer fountain solution to the cylinder. Of the possible combinations, three are in common use. So-called "conventional" dampening systems utilize dampening rollers that are separate from the inking system in conjunction with cloth-covered form rollers and ductor rollers in both ink and water fountains. In a combined ink and dampening system, fountain solution is carried to the cylinder on ink-covered rollers. Ductor rollers are included in the ink and dampening fountains. Since there is no distinction between ink and dampening form rollers, no cloth is generally used on the form rollers. These configurations are called integrated dampening systems or indirect dampening systems. So-called "continuous-flow" dampening systems typically do not employ ductor rollers to deliver dampening solution. There are two types—inker-feed and plate-feed—and both use metering rollers instead of ductors. The inker-feed systems operate in a manner similar to integrated dampening systems in that only one set of form rollers is employed. Cylinder-feed systems have separate ink and water trains like conventional dampening systems and may employ cloth-wrapped form rollers.

Print Station

Figure 6:
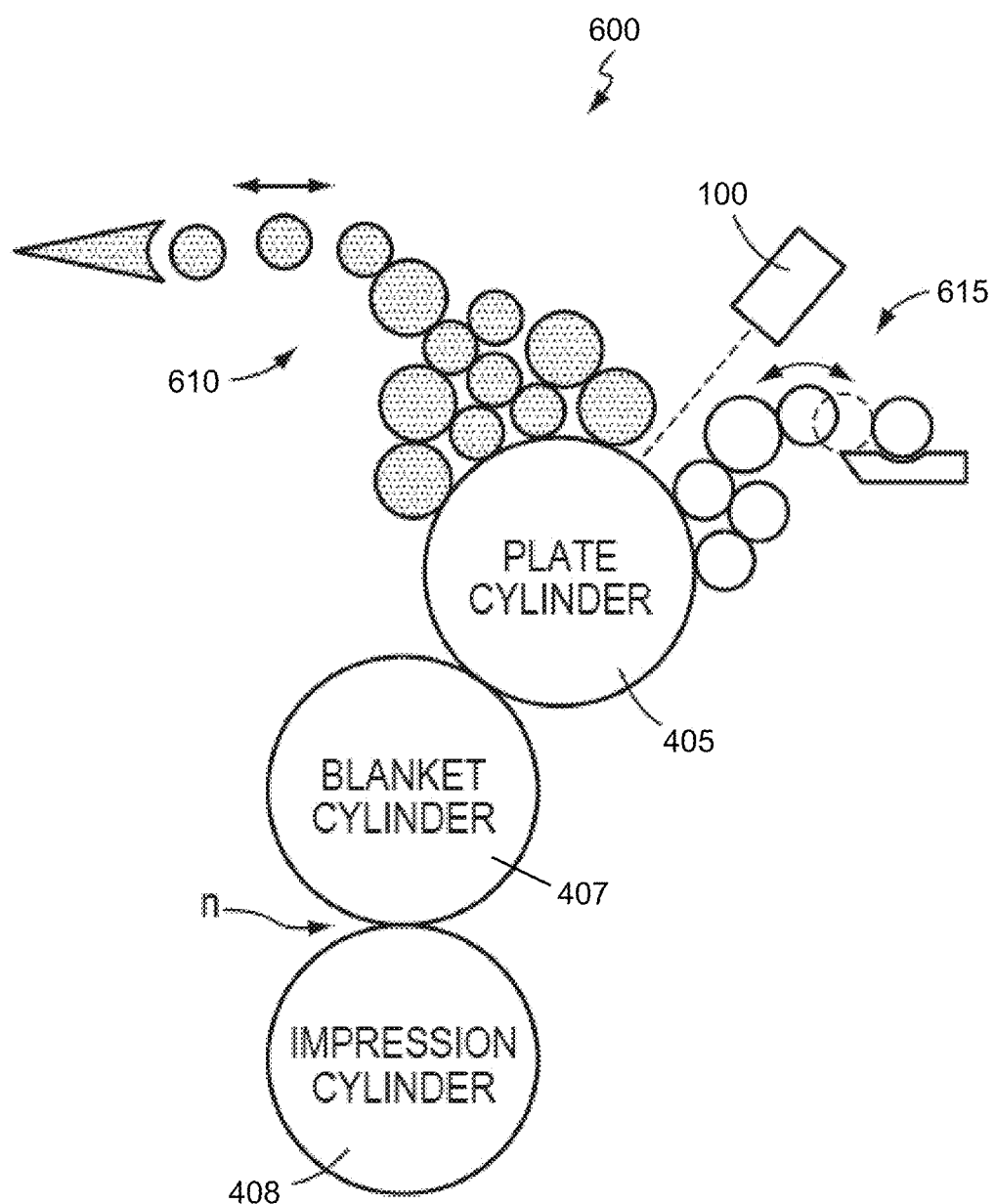
FIG. 6 schematically illustrates a printing station suitable for use in connection with embodiments of the present invention.

FIG. 6 depicts the components of a representative print station 600 suitable for implementing embodiments of the present invention, and which may be used in connection with any suitable press configuration. In various embodiments, the print station 600 includes a plate cylinder 405, a blanket cylinder 407 and an impression cylinder 408, as well as an inking system 410 and a dampening system 415 as described above. In particular, inking system 410 and dampening system 415 include conventional trains of form, distribution, doctor, and fountain rollers as schematically indicated.

The print station 600 may apply a subtractive ink in accordance with the color gamut (e.g., the CMYK gamut) selected by the press operator. The press may include at least as many print stations as there are colors in the gamut, and may include further stations to apply, for example, a finishing treatment. In a linear press, the print stations 600 are arranged in an in-line configuration; see, e.g., U.S. Pat. No. 4,936,211 (the '211 patent), the entire disclosure of which is incorporated by reference herein. In various embodiments, the printing path transports a cut sheet of recording material from a source through the successive print stations, following which printed sheets are collected in a stack. Alternatively, the system may be web-based rather than sheet-fed. The control systems associated with each of the printing stations store (or retrieve from a central storage facility) "color separations" of the image to be printed, each separation corresponding to one color of the gamut.

In a central-impression press, the recording medium is pinned to the surface of a master drum 408, which, as it rotates, brings the medium into contact with print stations arranged circumferentially therearound; see, e.g., the '211 patent.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A laser apparatus comprising:
   first and second seed lasers each emitting an output beam differing in at least one beam characteristic, wherein the first and second seed lasers are (i) both fiber lasers, (ii) operated in a complementary fashion, and (iii) modulated in accordance with a substantially random frequency;
   a coupler for combining the output beams of the seed lasers into a combined beam, the combined beam having a substantially constant power as a function of time;
   a first isolator, disposed between the first seed laser and the coupler, positioned to receive the output beam of the first seed laser;
   a second isolator, different from the first isolator, disposed between the second seed laser and the coupler, positioned to receive the output beam of the second seed laser;
   at least one amplifier for increasing a power of the combined beam, thereby forming an amplified beam;
   a resonant phase modulator disposed between the coupler and the at least one amplifier, the resonant phase modulator broadening an optical spectrum of the combined beam prior to amplification thereof;
   a third isolator, different from the first and second isolators, disposed between the coupler and the at least one amplifier, positioned to receive the combined beam; and
   a separator for separating the amplified beam into first and second final output beams based on the at least one beam characteristic, the second final output beam being absorbed by the separator or discarded after separation,
   wherein (i) the first and second seed lasers, the coupler, the at least one amplifier, the separator, the resonant phase modulator, and the first, second, and third isolators are all fiber-coupled, and (ii) a line width of the at least one amplifier is less than a line width of the combined beam, whereby Brillouin scattering is suppressed in the at least one amplifier due at least in part to the spectral broadening by the resonant phase modulator.

2. The laser apparatus of claim 1, wherein the at least one beam characteristic is wavelength or polarization or both wavelength and polarization.

3. The laser apparatus of claim 1, wherein the at least one amplifier comprises a plurality of fiber amplifiers, the apparatus further comprising an inter-stage isolator disposed between two of the fiber amplifiers.

4. The laser apparatus of claim 1, wherein the second final output beam is directed into a beam dump.

5. The laser apparatus of claim 1, wherein the second final output beam is absorbed by the separator.

6. The laser apparatus of claim 1, wherein the separator comprises at least one of a dichroic minor, a polarization division demultiplexer, or a wavelength division demultiplexer.

7. The laser apparatus of claim 1, wherein the first and second seed lasers emit at wavelengths that differ from each other by an amount ranging from approximately 9 nm to approximately 100 nm.

8. The laser apparatus of claim 1, further comprising an isolator and a collimator disposed between the at least one amplifier and the separator.

9. The laser apparatus of claim 1, further comprising, associated with each seed laser, a modulator that modulates the output beam of the seed laser.

10. The laser apparatus of claim 9, wherein the modulator comprises an acousto-optic modulator or an electro-optic modulator.

11. The laser apparatus of claim 1, further comprising a harmonic generator associated with the separator and positioned to receive the amplified beam and multiply a frequency thereof prior to output of the first final output beam, wherein a frequency of the first final output beam is larger than a frequency of the amplified beam by at least a factor of two.

12. A method of operating a laser apparatus comprising (i) first and second seed lasers each emitting an output beam differing in at least one beam characteristic, wherein the first and second seed lasers are (a) both fiber lasers, (b) operated in a complementary fashion, and (c) modulated in accordance with a substantially random frequency, (ii) a coupler for combining the output beams of the seed lasers into a combined beam, the combined beam having a substantially constant power as a function of time, (iii) a first isolator, disposed between the first seed laser and the coupler, positioned to receive the output beam of the first seed laser, (iv) a second isolator, different from the first isolator, disposed between the second seed laser and the coupler, positioned to receive the output beam of the second seed laser, (v) at least one amplifier for increasing a power of the combined beam, thereby forming an amplified beam, (vi) a resonant phase modulator disposed between the coupler and the at least one amplifier, the resonant phase modulator broadening an optical spectrum of the combined beam prior to amplification thereof, (vii) a third isolator, different from the first and second isolators, disposed between the coupler and the at least one amplifier, positioned to receive the combined beam, and (viii) a separator for separating the amplified beam into first and second final output beams based on the at least one beam characteristic, the second final output beam being absorbed by the separator or discarded after separation, wherein (i) the first and second seed lasers, the coupler, the at least one amplifier, the separator, the resonant phase modulator, and the first, second, and third isolators are all fiber-coupled, and (ii) a line width of the at least one amplifier is less than a line width of the combined beam, whereby Brillouin scattering is suppressed in the at least one amplifier due at least in part to the spectral broadening by the resonant phase modulator, the method comprising:

operating the first and second seed lasers in a complementary fashion, such that each seed laser emits its output beam only when the other does not;

combining the output beams of the seed lasers into the combined beam;

amplifying the combined beam so as to suppress Brillouin scattering; and separating the combined beam into the two final output beams differing in the at least one beam characteristic.

13. The method of claim 12, wherein the at least one beam characteristic is wavelength or polarization or both wavelength and polarization.

14. The method of claim 12, wherein the combined beam is amplified with the at least one amplifier.

15. The method of claim 12, further comprising discarding one of the two final output beams.

16. The method of claim 12, further comprising directing one of the two final output beams to a printing cylinder of a plateless lithographic printing system to create an image thereon.

17. The method of claim 12, wherein the seed lasers have different rise times, and operating the seed lasers comprises staggering electrical signals thereto, such that the combined beam has substantially constant power as a function of time.

18. The method of claim 12, wherein separating the combined beam comprises directing the combined beam into the separator, the separator comprising a wavelength separator.

19. The method of claim 18, wherein the wavelength separator comprises at least one of a dichroic mirror, a polarization division demultiplexer, or a wavelength division demultiplexer.

20. The method of claim 12, wherein the seed lasers are modulated at a random frequency corresponding to an incoming data stream.

21. A method of printing comprising:
providing a hydrophilic, ink-receptive lithographic surface having a printing area;
applying a polar liquid to the printing area for adsorption thereon;
producing a laser output with an apparatus comprising:
first and second seed lasers each emitting an output beam differing in at least one beam characteristic, wherein the first and second seed lasers are (i) both fiber lasers, (ii) operated in a complementary fashion, and (iii) modulated in accordance with a substantially random frequency,
a coupler for combining the output beams of the seed lasers into a combined beam, the combined beam having a substantially constant power as a function of time,
a first isolator, disposed between the first seed laser and the coupler, positioned to receive the output beam of the first seed laser,
a second isolator, different from the first isolator, disposed between the second seed laser and the coupler, positioned to receive the output beam of the second seed laser,
at least one amplifier for increasing a power of the combined beam, thereby forming an amplified beam,
a resonant phase modulator disposed between the coupler and the at least one amplifier, the resonant phase modulator broadening an optical spectrum of the combined beam prior to amplification thereof,
a third isolator, different from the first and second isolators, disposed between the coupler and the at least one amplifier, positioned to receive the combined beam, and
a separator for separating the amplified beam into first and second final output beams based on the at least one beam characteristic, the second final output beam being absorbed by the separator or discarded after separation,
wherein (i) the first and second seed lasers, the coupler, the at least one amplifier, the separator, the resonant phase modulator, and the first, second, and third isolators are all fiber-coupled, and (ii) a line width of the at least one amplifier is less than a line width of the combined beam, whereby Brillouin scattering is suppressed in the at least one amplifier due at least in part to the spectral broadening by the resonant phase modulator;
exposing the liquid-bearing printing area to the laser output in an imagewise fashion, the laser output substantially removing the adsorbed liquid without damaging the printing surface;
applying ink to the printing area, the ink adhering to the surface only where the polar liquid has been removed by the laser output; and
transferring the ink to a recording medium.

22. The method of claim 21, wherein the imagewise laser output is applied at a frequency exceeding approximately 50 MHz and has a power ranging from approximately 10 W to approximately 100 W.

23. The method of claim 21, wherein the at least one beam characteristic is wavelength or polarization or both wavelength and polarization.

24. A method of printing comprising:
providing a hydrophilic, ink-receptive lithographic surface having a printing area;
applying ink to the printing area for adsorption thereon;
producing a laser output with an apparatus comprising:
first and second seed lasers each emitting an output beam differing in at least one beam characteristic, wherein the first and second seed lasers are (i) both fiber lasers, (ii) operated in a complementary fashion, and (iii) modulated in accordance with a substantially random frequency,
a coupler for combining the output beams of the seed lasers into a combined beam, the combined beam having a substantially constant power as a function of time,
a first isolator, disposed between the first seed laser and the coupler, positioned to receive the output beam of the first seed laser,
a second isolator, different from the first isolator, disposed between the second seed laser and the coupler, positioned to receive the output beam of the second seed laser,
at least one amplifier for increasing a power of the combined beam, thereby forming an amplified beam,
a resonant phase modulator disposed between the coupler and the at least one amplifier, the resonant phase modulator broadening an optical spectrum of the combined beam prior to amplification thereof,
a third isolator, different from the first and second isolators, disposed between the coupler and the at least one amplifier, positioned to receive the combined beam, and
a separator for separating the amplified beam into first and second final output beams based on the at least one beam characteristic, the second final output beam being absorbed by the separator or discarded after separation,
wherein (i) the first and second seed lasers, the coupler, the at least one amplifier, the separator, the resonant phase modulator, and the first, second, and third isolators are all fiber-coupled, and (ii) a line width of the at least one amplifier is less than a line width of the combined beam, whereby Brillouin scattering is suppressed in the at least one amplifier due at least in part to the spectral broadening by the resonant phase modulator;
exposing the ink-bearing printing area to the laser output in an imagewise fashion, the laser output fixing the adsorbed ink on the printing surface;
applying a polar liquid to the printing area, the polar liquid removing ink that has not received laser exposure; and
transferring the remaining ink to a recording medium.

25. The method of claim 24, wherein the imagewise laser output is applied at a frequency exceeding approximately 50 MHz and has a power ranging from approximately 10 W to approximately 100 W.

26. The method of claim 24, wherein the at least one beam characteristic is wavelength or polarization or both wavelength and polarization.

27. A printing apparatus comprising:
a hydrophilic, ink-receptive lithographic surface having a printing area;
means for applying a polar liquid to the printing area for adsorption thereon;
means for exposing the liquid-bearing printing area to a laser output in an imagewise fashion, whereby the laser output substantially removes the adsorbed liquid without damaging the printing surface;
means for applying ink to the printing area such that the ink adheres to the surface only where the polar liquid has been removed by the laser; and
means facilitating transfer of the ink to a recording medium,
wherein the exposing means comprises:
first and second seed lasers each emitting an output beam differing in at least one beam characteristic, wherein the first and second seed lasers are (i) both fiber lasers, (ii) operated in a complementary fashion, and (iii) modulated in accordance with a substantially random frequency;
a coupler for combining the output beams of the seed lasers into a combined beam, the combined beam having a substantially constant power as a function of time;
a first isolator, disposed between the first seed laser and the coupler, positioned to receive the output beam of the first seed laser;
a second isolator, different from the first isolator, disposed between the second seed laser and the coupler, positioned to receive the output beam of the second seed laser;
at least one amplifier for increasing a power of the combined beam, thereby forming an amplified beam;
a resonant phase modulator disposed between the coupler and the at least one amplifier, the resonant phase modulator broadening an optical spectrum of the combined beam prior to amplification thereof;
a third isolator, different from the first and second isolators, disposed between the coupler and the at least one amplifier, positioned to receive the combined beam; and
a separator for separating the amplified beam into first and second final output beams based on the at least one beam characteristic, the second final output beam being absorbed by the separator or discarded after separation,
wherein (i) the first and second seed lasers, the coupler, the at least one amplifier, the separator, the resonant phase modulator, and the first, second, and third isolators are all fiber-coupled, and (ii) a line width of the at least one amplifier is less than a line width of the combined beam, whereby Brillouin scattering is suppressed in the at least one amplifier due at least in part to the spectral broadening by the resonant phase modulator.

28. The printing apparatus of claim 27, wherein the at least one beam characteristic is wavelength or polarization or both wavelength and polarization.

29. A printing apparatus comprising:
a hydrophilic, ink-receptive lithographic surface having a printing area;
means for applying ink to the printing area for adsorption thereon;
means for exposing the ink-bearing printing area to a laser output in an imagewise fashion, whereby the laser output fixes the adsorbed ink on the printing surface;
means for applying a polar liquid to the printing area to remove ink that has not received laser exposure; and
means facilitating transfer of the remaining ink to a recording medium, wherein the exposing means comprises:
    first and second seed lasers each emitting an output beam differing in at least one beam characteristic, wherein the first and second seed lasers are (i) both fiber lasers, (ii) operated in a complementary fashion, and (iii) modulated in accordance with a substantially random frequency;
    a coupler for combining the output beams of the seed lasers into a combined beam, the combined beam having a substantially constant power as a function of time;
    a first isolator, disposed between the first seed laser and the coupler, positioned to receive the output beam of the first seed laser;
    a second isolator, different from the first isolator, disposed between the second seed laser and the coupler, positioned to receive the output beam of the second seed laser;
    at least one amplifier for increasing a power of the combined beam, thereby forming an amplified beam;
    a resonant phase modulator disposed between the coupler and the at least one amplifier, the resonant phase modulator broadening an optical spectrum of the combined beam prior to amplification thereof;
    a third isolator, different from the first and second isolators, disposed between the coupler and the at least one amplifier, positioned to receive the combined beam; and
    a separator for separating the amplified beam into first and second final output beams based on the at least one beam characteristic, the second final output beam being absorbed by the separator or discarded after separation,
    wherein (i) the first and second seed lasers, the coupler, the at least one amplifier, the separator, the resonant phase modulator, and the first, second, and third isolators are all fiber-coupled, and (ii) a line width of the at least one amplifier is less than a line width of the combined beam, whereby Brilliouin scattering is suppressed in the at least one amplifier due at least in part to the spectral broadening by the resonant phase modulator.

30. The printing apparatus of claim 29, wherein the at least one beam characteristic is wavelength or polarization or both wavelength and polarization.

31. The laser apparatus of claim 1, wherein the first, second, and third isolators are all polarization-dependent.

* * * * *

UNITED STATES PATENT AND TRADEMARK OFFICE
CERTIFICATE OF CORRECTION

| | |
|---|---|
| PATENT NO. | : 8,798,104 B2 |
| APPLICATION NO. | : 12/898915 |
| DATED | : August 5, 2014 |
| INVENTOR(S) | : Nanda Nathan |

Page 1 of 1

It is certified that error appears in the above-identified patent and that said Letters Patent is hereby corrected as shown below:

In the Claims:

At column 18, claim number 6, line number 52, "minor" should read: --mirror--.

Signed and Sealed this
Seventeenth Day of February, 2015

Michelle K. Lee
*Deputy Director of the United States Patent and Trademark Office*